(12) United States Patent
Shim et al.

(10) Patent No.: US 10,192,935 B2
(45) Date of Patent: Jan. 29, 2019

(54) DISPLAY DEVICE

(71) Applicant: LG Display Co., Ltd., Seoul (KR)

(72) Inventors: Jongsik Shim, Paju-si (KR); Byeonguk Gang, Paju-si (KR); Hyunjin Kim, Paju-si (KR); Seonghwan Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/684,785

(22) Filed: Aug. 23, 2017

(65) Prior Publication Data
US 2018/0061908 A1 Mar. 1, 2018

(30) Foreign Application Priority Data

Aug. 31, 2016 (KR) .................. 10-2016-0112161

(51) Int. Cl.
*H01L 27/15* (2006.01)
*H01L 31/12* (2006.01)
*H01L 27/32* (2006.01)
*G09G 3/32* (2016.01)

(52) U.S. Cl.
CPC .......... *H01L 27/3213* (2013.01); *G09G 3/32* (2013.01); *H01L 27/326* (2013.01); *H01L 27/3225* (2013.01); *H01L 27/3262* (2013.01); *H01L 27/3265* (2013.01); *H01L 27/3272* (2013.01); *H01L 27/3276* (2013.01); *H01L 27/3279* (2013.01)

(58) Field of Classification Search
CPC ....... H01L 2924/12041; H01L 27/3244; H01L 2251/5338; H01L 27/3258; H01L 27/32; H01L 27/3262
USPC .......................................................... 257/79
See application file for complete search history.

(56) References Cited

U.S. PATENT DOCUMENTS

2009/0289258 A1* 11/2009 Kim .................. H01L 29/66765
257/66

FOREIGN PATENT DOCUMENTS

| KR | 10-2015-0073611 A | 7/2015 |
| KR | 10-2016-0083190 A | 7/2016 |

* cited by examiner

*Primary Examiner* — Theresa T Doan
(74) *Attorney, Agent, or Firm* — Polsinelli PC

(57) ABSTRACT

A display device includes a substrate, a light shielding layer on the substrate, first to fourth subpixels sequentially arranged on the substrate including the light shielding layer in a horizontal direction, a first power line disposed on one side of the first subpixel and shared by the first and second subpixels, a sensing line disposed between the second subpixel and the third subpixel and shared by the first to fourth subpixels, a second power line disposed on one side of the fourth subpixel and shared by the third and fourth subpixels, first and second data lines between the first and second subpixels and third and fourth data lines between the third and fourth subpixels; and a scan line extended on the first to fourth subpixels in the horizontal direction.

21 Claims, 10 Drawing Sheets

DISPLAY DEVICE

CROSS-REFERENCE TO RELATED APPLICATION

This application claims the benefit of Korean Patent Application No. 10-2016-0112161 filed in the Republic of Korea on Aug. 31, 2016, which is hereby incorporated by reference in its entirety.

BACKGROUND

Field of the Disclosure

The present disclosure relates to a display device, and more particularly, to a display device capable of preventing a short circuit between electrodes and improving an aperture ratio of the display device.

Description of the Background

Various types of flat panel displays (FPDs) have been used to replace heavier and larger cathode ray tubes (CRTs). Examples of the flat panel display include a liquid crystal display (LCD), a field emission display (FED), a plasma display panel (PDP), and an organic light emitting diode (OLED) display. In more detail, an OLED display is a self-emission display device emitting light by exciting an organic compound. The OLED display does not require a backlight unit as needed in a liquid crystal display, and thus, has a thin profile, light weight, and a simple manufacturing process. The OLED display can be also manufactured at a low temperature and has a fast response time of 1 ms or less, low power consumption, a wide viewing angle, and a high contrast.

Further, the OLED display includes a light emitting layer formed of an organic material between a first electrode serving as an anode and a second electrode serving as a cathode. The OLED display forms hole-electron pairs, i.e., excitons, by combining holes received from the first electrode with electrons received from the second electrode inside the light emitting layer and emits light by energy generated when the excitons return to the ground level. The OLED display is generally classified into a bottom emission OLED display and a top emission OLED display depending on the direction of light emitted from the OLED device. The bottom emission OLED display emits light in a downward direction toward a substrate, i.e., the direction from an emission layer to a first electrode. The top emission OLED display emits light in an upward direction away from a substrate, i.e., the direction from an emission layer to a second electrode.

As display devices are increasingly implemented as high-resolution display devices, smaller-sized pixels are required. Design conditions become limited in a layout in which a circuit is formed within a limited space of a subpixel. In such a case, a short circuit may occur between electrodes, which may result in a defective drive, and an improvement thereof is required. In addition, there is a problem of a reduction in an aperture ratio due to an area of the subpixel occupied by a capacitor.

SUMMARY

Accordingly, aspects of the present disclosure are directed to a display device that substantially obviates one or more of the problems due to limitations and disadvantages of the related art.

More specifically, the present disclosure is to provide a display device capable of preventing a short circuit between electrodes resulting from a restriction of limited design conditions on a layout in which a circuit is formed within a limited space of a subpixel when a display panel is implemented as a high-resolution (for example, UHD or higher resolution) display panel and capable of improving an aperture ratio.

In one aspect of the present disclosure, there is provided a display device including a substrate, a light shielding layer on the substrate, first to fourth subpixels sequentially arranged on the substrate including the light shielding layer in a horizontal direction, a first power line disposed on one side of the first subpixel and shared by the first and second subpixels, a sensing line disposed between the second subpixel and the third subpixel and shared by the first to fourth subpixels, a second power line disposed on one side of the fourth subpixel and shared by the third and fourth subpixels, first and second data lines disposed between the first subpixel and the second subpixel and third and fourth data lines disposed between the third subpixel and the fourth subpixel, and a scan line extended in the first to fourth subpixels in the horizontal direction, wherein the first to fourth data lines, the sensing line, and the first and second power lines are disposed on the same plane as the light shielding layer.

In another aspects of the present disclosure, A display device comprising first, second, third and fourth subpixels arranged on a substrate in a horizontal direction, each subpixel having a driving transistor, a switching transistor, and a sensing transistor includes a light shielding layer on the substrate, shielding external light and connected to a source electrode of the driving transistor; a first power line disposed on one side of the first subpixel and connected to the first and second subpixels by first and second bridges extended from the first power line through a first power contact hole; a sensing line disposed between the second subpixel and the third subpixel and commonly connected to the first to fourth subpixels; a second power line disposed on one side of the fourth subpixel and connected to the third and fourth subpixels by third and fourth bridges extended from the second power line through a second power contact hole; first and second data lines disposed between the first subpixel and the second subpixel and third and fourth data lines disposed between the third subpixel and the fourth subpixel; and a scan line on the first to fourth subpixels and extended to the horizontal direction, wherein the first to fourth data lines, the sensing line, and the first and second power lines are disposed on the same plane as the light shielding layer.

The scan line is disposed on a layer different from the first to fourth data lines, the sensing line, and the first and second power lines.

The sensing line includes a vertical sensing line and a horizontal sensing line. The vertical sensing line is integrated with the sensing line and is disposed in parallel with the first data line, and the horizontal sensing line is disposed on the same plane as the scan line in parallel with the scan line.

The sensing line is connected to each of the first to fourth subpixels through first to fourth horizontal sensing lines divided from the horizontal sensing line.

The first power line includes a first bridge and a second bridge that are connected to each other through a power contact hole. The first bridge is connected to the first subpixel, and the second bridge is connected to the second subpixel. The second power line includes a third bridge and a fourth bridge that are connected to each other through a power contact hole. The third bridge is connected to the fourth subpixel, and the fourth bridge is connected to the third subpixel.

A first gate electrode is positioned in each of the first to fourth subpixels and is connected to the scan line through gate contact holes underlying the scan line.

The first gate electrode is formed in an island shape, and both ends of the first gate electrode are connected to the scan line.

Each of the first to fourth subpixels includes a switching transistor overlapping the scan line, a sensing transistor connected to the sensing line, a driving transistor connected to the first power line or the second power line, and a first electrode connected to the driving transistor.

In each of the first to fourth subpixels, one end of a drain electrode of the switching transistor is connected to a second gate electrode of the driving transistor, and the other end is connected to the light shielding layer.

The light shielding layer and a semiconductor layer of the driving transistor form a first capacitor, the semiconductor layer of the driving transistor and the drain electrode of the switching transistor form a second capacitor, and the drain electrode of the switching transistor and the first electrode form a third capacitor.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. Names of the respective elements used in the following explanations are selected only for convenience of writing the specification and may be thus different from those used in actual products.

A display device according to an example aspect may be implemented as an organic light emitting diode (OLED) display, a liquid crystal display (LCD), an electrophoresis display, and the like. Aspects are described using the OLED display by way of example. An OLED display includes an emission layer that is formed of an organic material between a first electrode serving as an anode and a second electrode serving as a cathode. The OLED display is a self-emission display device configured to form hole-electron pairs, i.e., excitons, by combining holes received from the first electrode and electrons received from the second electrode inside the emission layer and emit light by energy generated when the excitons return to a ground level. The OLED display according to the aspect may be a plastic display device in which a display element is formed on a flexible plastic substrate rather than a glass substrate.

Figure 1:
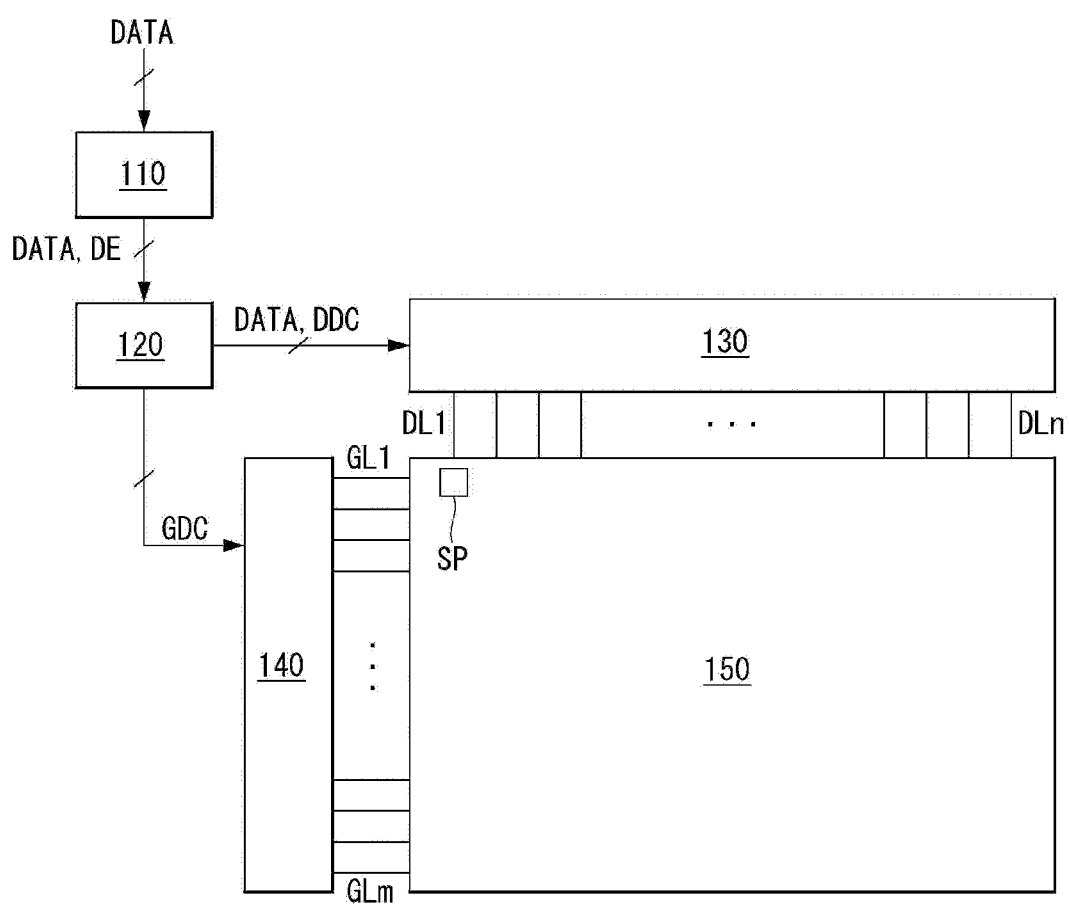
FIG. 1 is a schematic block diagram of an organic light emitting diode (OLED) display according to an aspect of the present disclosure.
Figure 2:
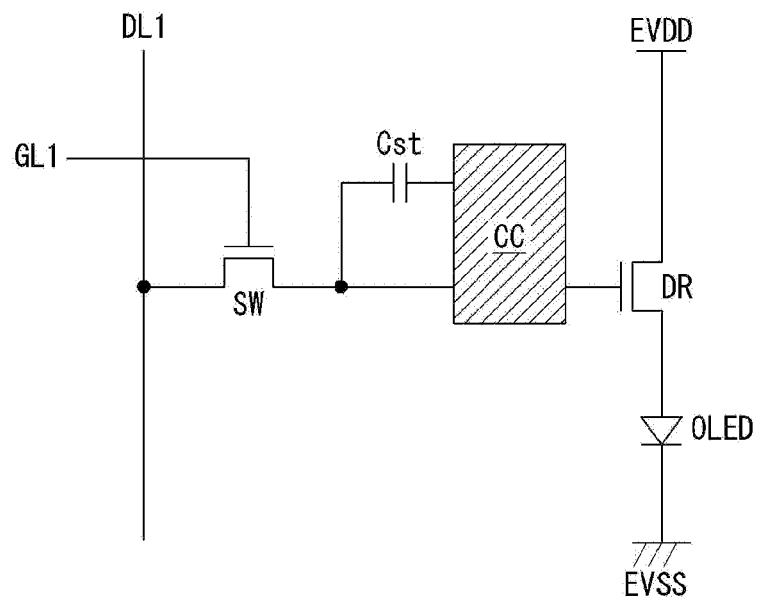
FIG. 2 schematically illustrates a circuit configuration of a subpixel.
Figure 3:
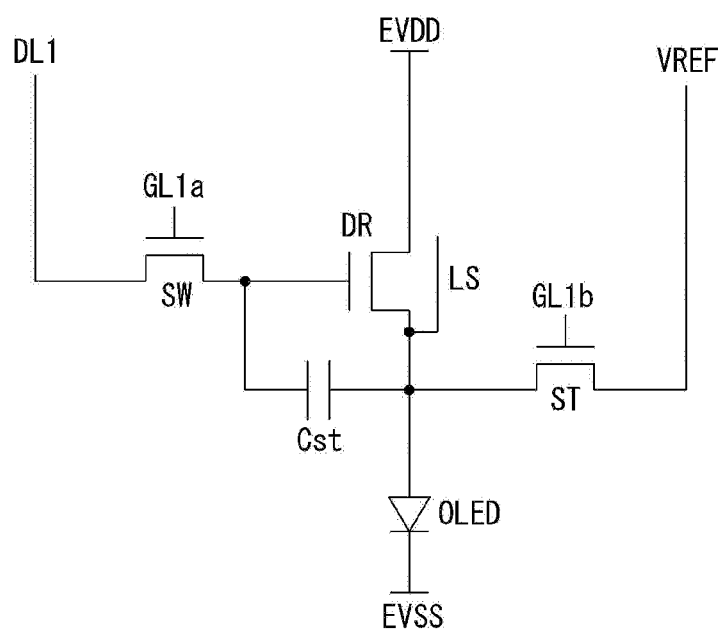
FIG. 3 illustrates an example of a circuit configuration of a subpixel according to an aspect of the present disclosure.
Figure 4:
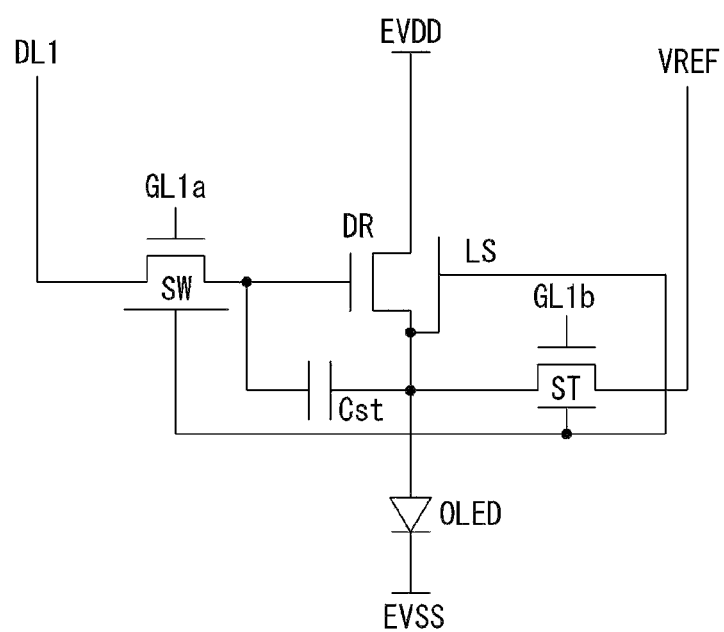
FIG. 4 illustrates another example of a circuit configuration of a subpixel according to an aspect of the present disclosure.

FIG. 1 is a block diagram of an OLED display according to an example aspect. FIG. 2 schematically illustrates a circuit configuration of a subpixel. FIG. 3 illustrates an example of a circuit configuration of a subpixel according to an aspect of the present disclosure. FIG. 4 illustrates another example of a circuit configuration of a subpixel according to an aspect of the present disclosure.

As shown in FIG. 1, an OLED display according to an aspect may include an image processing unit 110, a timing controller 120, a data driver 130, a scan driver 140, and a display panel 150.

The image processing unit 110 outputs a data signal DATA, a data enable signal DE, etc. supplied from the outside source. The image processing unit 110 may output one or more of a vertical sync signal, a horizontal sync signal, and a clock signal in addition to the data enable signal DE. For the sake of brevity and ease of reading, these signals are not shown.

The timing controller 120 receives the data signal DATA and driving signals including the data enable signal DE or the vertical sync signal, the horizontal sync signal, the clock signal, etc. from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC received from the timing controller 120 and converts the sampled and latched data signal DATA into a gamma reference voltage. The data driver 130 outputs the data signal DATA to data lines DL1 to DLn. The data driver 130 may be formed in the form of an integrated circuit (IC).

The scan driver 140 outputs a scan signal while shifting a level of a gate voltage in response to the gate timing control signal GDC received from the timing controller 120. The scan driver 140 outputs the scan signal to scan lines GL1 to GLm. The scan driver 140 may be formed in the form of an IC or formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP operated to display an image.

The subpixels SP may be configured as a top emission structure, a bottom emission structure, or a dual emission structure. The subpixels SP may include red subpixels, green subpixels, and blue subpixels, or may include white subpixels, red subpixels, green subpixels, and blue subpixels. Further, the subpixels SP may have one or more different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first scan line GL1. The driving transistor DR enables a driving current to flow between a first power line EVDD and a second power line EVSS based on the data voltage stored in the capacitor Cst. The organic light emitting diode OLED emits light depending on the driving current formed by the driving transistor DR.

The compensation circuit CC is a circuit added to the subpixel and compensates for a threshold voltage of the driving transistor DR. The compensation circuit CC includes one or more transistors. Configuration of the compensation circuit CC may be variously changed depending on a compensation method and is described below with reference to FIGS. 3 and 4.

As shown in FIGS. 3 and 4, the compensation circuit CC includes a sensing transistor ST and a sensing line VREF. The sensing transistor ST is connected to a sensing node between a source line of the driving transistor DR and an anode electrode (or referred to as "first electrode") of the organic light emitting diode OLED. The sensing transistor ST may operate to supply an initialization voltage (or referred to as "sensing voltage") transferred through the sensing line VREF to the sensing node or to sense a voltage or a current of the sensing node.

A source electrode of the switching transistor SW is connected to the first data line DL1, and a drain electrode of the switching transistor SW is connected to a gate electrode of the driving transistor DR. A source electrode of the driving transistor DR is connected to the first power line EVDD, and a drain electrode of the driving transistor DR is connected to the anode electrode of the organic light emitting diode OLED. A lower electrode of the capacitor Cst is connected to the gate electrode of the driving transistor DR, and an upper electrode of the capacitor Cst is connected to the anode electrode of the organic light emitting diode OLED. The anode electrode of the organic light emitting diode OLED is connected to the drain electrode of the driving transistor DR, and a cathode electrode of the organic light emitting diode OLED is connected to the second power line EVSS. A source electrode of the sensing transistor ST is connected to the sensing line VREF, and a drain electrode of the sensing transistor ST is connected to the anode electrode of the organic light emitting diode OLED corresponding to the sensing node.

An operation time of the sensing transistor ST may be similar to (or the same as) or different from that of the switching transistor SW depending on a compensation algorithm (or the configuration of the compensation circuit). For example, a gate electrode of the switching transistor SW may be connected to a 1a scan line GL1a, and a gate electrode of the sensing transistor ST may be connected to a 1b scan line GL1b. As another example, the 1a scan line GL1a connected to the gate electrode of the switching transistor SW and the 1b scan line GL1b connected to the gate electrode of the sensing transistor ST may be commonly connected.

The sensing line VREF may be connected to the data driver. In this instance, the data driver may sense the sensing node of the subpixel during a non-display period of a real-time image or N frame and generate a sensing result, where N is an integer equal to or greater than 1. On the other hand, the switching transistor SW and the sensing transistor ST may be turned on at the same time. In this instance, a sensing operation through the sensing line VREF and a data output operation for outputting the data signal are separated (or distinguished) from each other based on a time division manner of the data driver.

In addition, a target to be compensated based on the sensing result may be a digital data signal, an analog data signal, a gamma signal, or the like. The compensation circuit for generating a compensation signal (or a compensation voltage) based on the sensing result may be implemented inside the data driver, inside the timing controller, or inside a separate circuit.

FIGS. 3 and 4 illustrate the subpixel having the configuration of 3T(Transistor)1C(Capacitor) including the switching transistor SW, the driving transistor DR, the capacitor Cst, the organic light emitting diode OLED and the sensing transistor ST, by way of example. However, when the compensation circuit CC is added to the subpixel, the subpixel may have various configurations such as 3T2C, 4T2C, 5T1C and 6T2C.

There is a difference between the subpixel circuit of FIG. 3 and the subpixel circuit of FIG. 4 in configuration of a light shielding layer LS. The light shielding layer LS functions to shield external light. When the light shielding layer LS is formed of a metallic material, a charged parasitic voltage is problematic. Therefore, the light shielding layer LS is connected to the source electrode of the driving transistor DR.

More specifically, as shown in FIG. 3, the light shielding layer LS may be disposed only below a channel region of the driving transistor DR. Alternatively, as shown in FIG. 4, the light shielding layer LS may be disposed below the channel region of the driving transistor DR and below channel regions of the switching transistor SW and the sensing transistor ST.

The light shielding layer LS may be used for shielding the external light as shown in FIG. 3. In addition, the light shielding layer LS may be connected to another electrode or another line and used as an electrode constituting the capacitor, and the like.

A structure of a subpixel array of the display device according to an aspect will be described in detail below.

Figure 5:
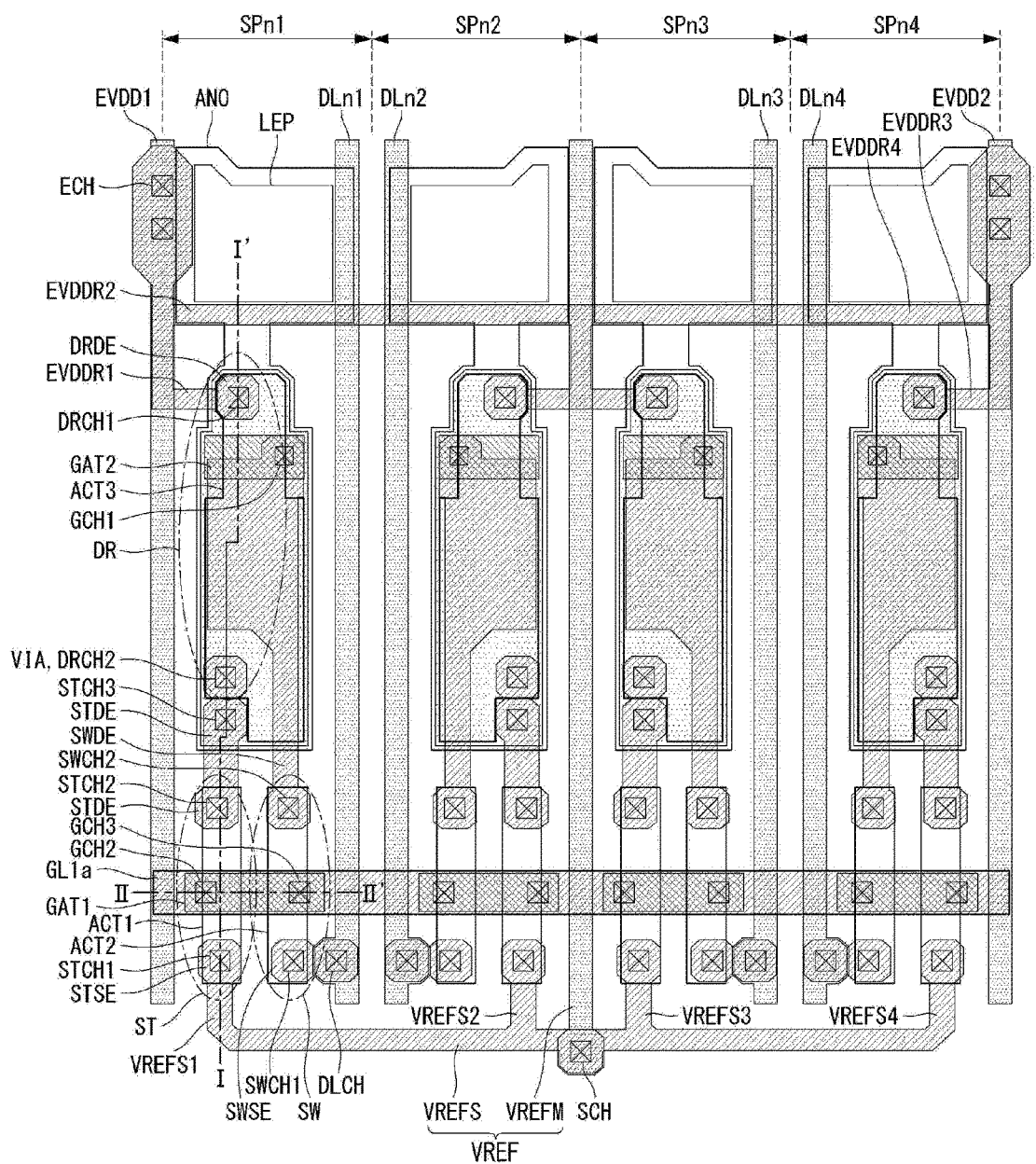
FIG. 5 is a plan view of a subpixel array according to an example of the aspect of the present disclosure.
Figure 6:
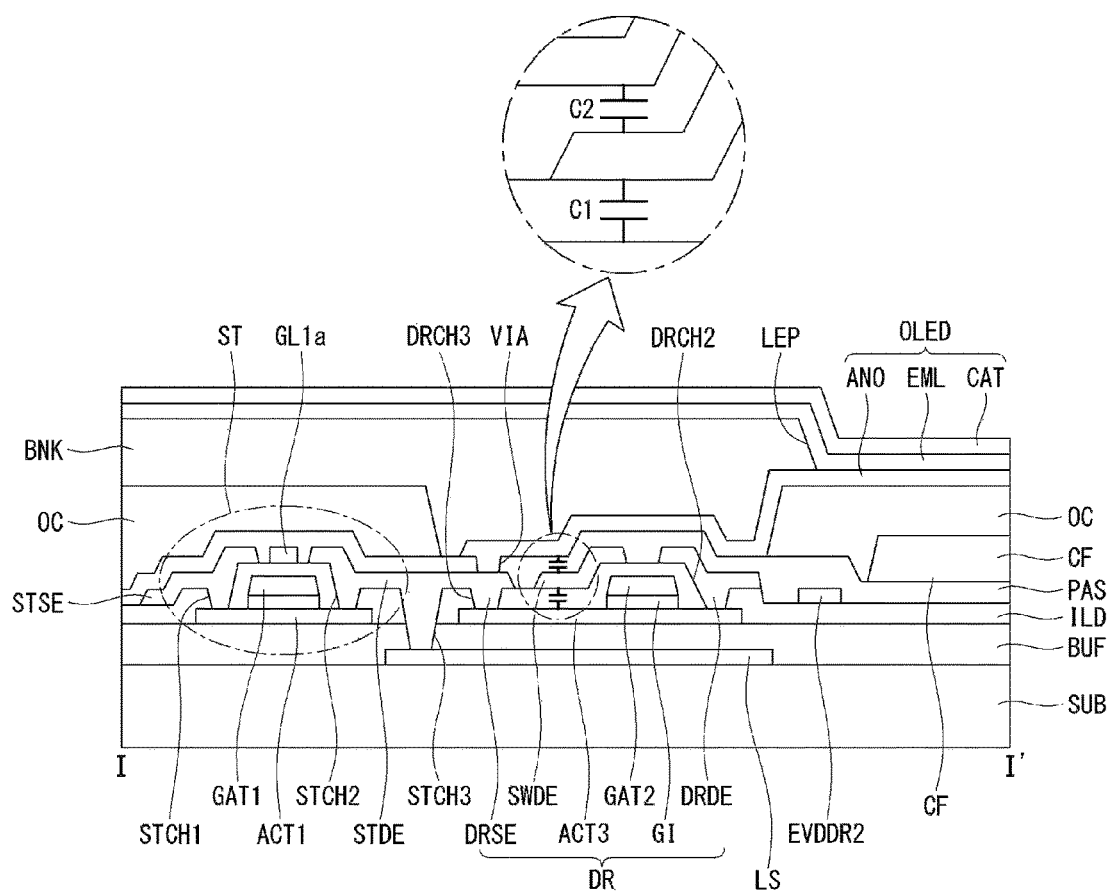
FIG. 6 is a cross-sectional view taken along line I-I' of FIG. 5.
Figure 7:
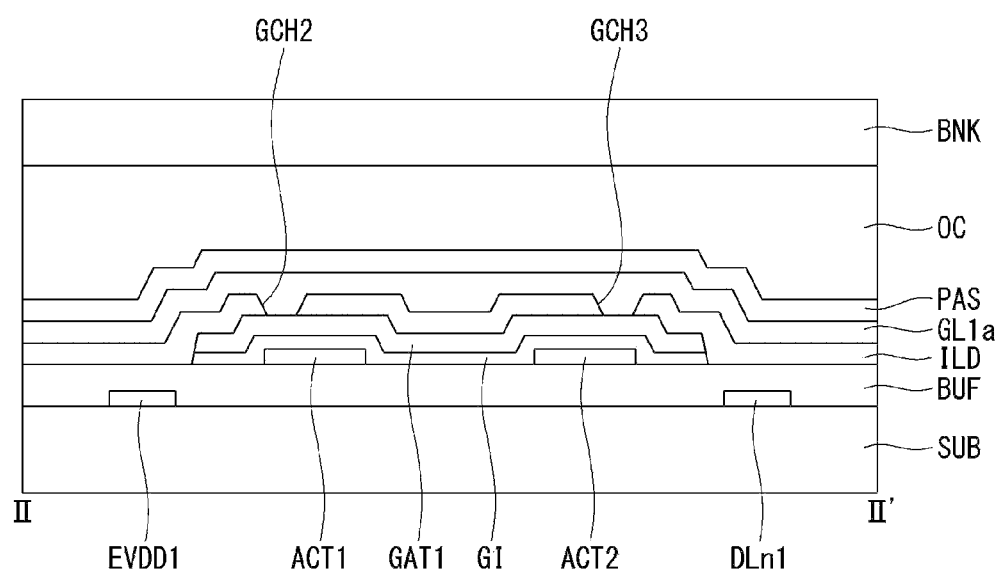
FIG. 7 is a cross-sectional view taken along line II-II' of FIG. 5.

FIG. 5 is a plan view of a subpixel array according to an example of the aspect of the present disclosure. FIG. 6 is a cross-sectional view taken along line I-I' of FIG. 5. FIG. 7 is a cross-sectional view taken along line II-II' of FIG. 5.

With reference to FIG. 5, first to fourth subpixels SPn1 to SPn4 are arranged in a horizontal direction (for example, X-axis direction). For example, the first subpixel SPn1 may be a red subpixel R, the second subpixel SPn2 may be a green subpixel G, and the third subpixel SPn3 may be a blue subpixel B. The fourth subpixel SPn4 may be selected as a white subpixel W. In some aspects, the first to third subpixels SPn1 to SPn3 may form a unit pixel, and three subpixels including the fourth subpixel SPn4 and two subpixels subsequent to the fourth subpixel SPn4 may form a unit pixel.

For example, each of RGB, WRG, BWR, and GBW may form a unit pixel. Alternatively, the first to fourth subpixels SPn1 to SPn4 may form a unit pixel, and each of WRGB and WRGB may form a unit pixel.

A first power line EVDD1 is disposed on the left side of the first subpixel SPn1 along a vertical direction (for example, Y-axis direction). The first power line EVDD1 is commonly connected to the first subpixel SPn1 and the second subpixel SPn2. The first power line EVDD1 includes a first bridge EVDDR1 that is extended from the first power line EVDD1 through a power contact hole ECH and is connected to the first subpixel SPn1, and a second bridge EVDDR2 that is extended from the first power line EVDD1 through a power contact hole ECH and is connected to the second subpixel SPn2. The first and second subpixels SPn1 and SPn2 are connected to the first power line EVDD1 through the first and second bridges EVDDR1 and EVDDR2. Although not shown, the first power line EVDD1 is commonly connected to two subpixels disposed on the left side of the first power line EVDD1.

A first data line DLn1 is disposed in an area of the first subpixel SPn1 that is extended away from the first power line EVDD1 and is adjacent to the second subpixel SPn2, and a second data line DLn2 is disposed in an area of the second subpixel SPn2 adjacent to the first data line DLn1. The first data line DLn1 is connected to the first subpixel SPn1, and the second data line DLn2 is connected to the second subpixel SPn2. A sensing line VREF is disposed between the second subpixel SPn2 and the third subpixel SPn3. The sensing line VREF is commonly connected to the first to fourth subpixels SPn1 to SPn4.

A third data line DLn3 is disposed in an area of the third subpixel SPn3 that is extended away from the sensing line VREF and is adjacent to the fourth subpixel SPn4, and a fourth data line DLn4 is disposed in an area of the fourth subpixel SPn4 adjacent to the third data line DLn3. The third data line DLn3 is connected to the third subpixel SPn3, and the fourth data line DLn4 is connected to the fourth subpixel SPn4. A second power line EVDD2 is disposed on the right side of the fourth subpixel SPn4 along the vertical direction. The second power line EVDD2 includes a third bridge EVDDR3 that is extended from the second power line EVDD2 through a power contact hole ECH and is connected to the fourth subpixel SPn4, and a fourth bridge EVDDR4 that is extended from the second power line EVDD2 through a power contact hole ECH and is connected to the third subpixel SPn3. The third and fourth subpixels SPn3 and SPn4 are connected to the second power line EVDD2 through the third and fourth bridges EVDDR3 and EVDDR4. Although not shown, the second power line EVDD2 is commonly connected to two subpixels disposed on the right side of the second power line EVDD2. The second bridge EVDDR2 and the fourth bridge EVDDR4 are connected to form one body and receive the same power voltage from the first power line EVDD1 and the second power line EVDD2.

A scan line GL1a perpendicularly intersecting the sensing line VREF is disposed on the first to fourth subpixels SPn1 to SPn4. The scan line GL1a is connected to gate electrodes of a sensing transistor ST and a switching transistor SW of each of the first to fourth subpixels SPn1 to SPn4. The scan line GL1a is disposed on a layer different from the first to fourth data lines DLn1 to DLn4, the sensing line VREF, and the first and second power lines EVDD1 and EVDD2. Namely, the scan line GL1a may be disposed on the same plane as a horizontal sensing line VREFS, a source electrode, and a drain electrode that will be described later. FIG. 5 illustrates one scan line GL1a, by way of example. However, aspects are not limited thereto. For example, two scan lines may be used.

The sensing line VREF includes a vertical sensing line VREFM disposed along the vertical direction and the horizontal sensing line VREFS disposed along the horizontal direction. The vertical sensing line VREFM is disposed on a layer different from the horizontal sensing line VREFS. Namely, the horizontal sensing line VREFS is connected to the vertical sensing line VREFM through a sensing contact hole SCH. The horizontal sensing line VREFS is disposed on the same plane as the source electrode and the drain electrode that will be described later. The vertical sensing line VREFM is disposed in parallel with the first to fourth data lines DLn1 to DLn4, and the horizontal sensing line VREFS is disposed in parallel with the scan line GL1a. The horizontal sensing line VREFS is divided into first to fourth horizontal sensing lines VREFS1 to VREFS4, and the first to fourth horizontal sensing lines VREFS1 to VREFS4 are respectively connected to the sensing transistors ST of the first to fourth subpixels SPn1 to SPn4. The first horizontal sensing line VREFS1 is connected to the first subpixel SPn1; the second horizontal sensing line VREFS2 is connected to the second subpixel SPn2; the third horizontal sensing line VREFS3 is connected to the third subpixel SPn3; and the fourth horizontal sensing line VREFS4 is connected to the fourth subpixel SPn4.

A plan structure of the subpixel is described using the first subpixel SPn1 as an example. The switching transistor SW is disposed at an intersection of the first data line DLn1 and the scan line GL1a, and the sensing transistor ST is disposed adjacent to the first horizontal sensing line VREFS1 and the scan line GL1a.

The sensing transistor ST includes a first source electrode STSE in which the first horizontal sensing line VREFS1 is connected to a first semiconductor layer ACT1 through a first sensing contact hole STCH1, a first drain electrode STDE connected to the first semiconductor layer ACT1 through a second sensing contact hole STCH2, and a first gate electrode GAT1 crossing the first semiconductor layer ACT1. The first drain electrode STDE of the sensing transistor ST is connected to a light shielding layer LS and prevents the light shielding layer LS underlying a driving transistor DR from electrically affecting the driving transistor DR.

The switching transistor SW includes a second source electrode SWSE that is connected to the first data line DLn1 through a data contact hole DLCH and is connected to a second semiconductor layer ACT2 through a first switching contact hole SWCH1, a second drain electrode SWDE connected to the second semiconductor layer ACT2 through a second switching contact hole SWCH2, and a first gate electrode GAT1 crossing the second semiconductor layer ACT2. The second drain electrode SWDE of the switching transistor SW is connected to a second gate electrode GAT2 of the driving transistor DR through a first gate contact hole GCH1.

The driving transistor DR includes a third drain electrode DRDE in which the first bridge EVDDR1 connected to the power contact hole ECH of the first power line EVDD1 is connected to a third semiconductor layer ACT3 through a first driving contact hole DRCH1. The first drain electrode STDE of the sensing transistor ST operates as a third source electrode of the driving transistor DR. A first electrode ANO is connected to the driving transistor DR through a via hole VIA, and an emission unit LEP is disposed on the first electrode ANO to emit light. As a result, the plan structure of the first subpixel SPn1 is completed.

More specifically, a cross-sectional structure of the display panel will be described below using a portion of the first subpixel as an example.

With reference to FIG. 6, a light shielding layer LS is positioned on a substrate SUB. The light shielding layer LS shields light coming from the outside and prevents a leakage current from being generated in a transistor. Thus, the light shielding layer LS is formed corresponding to a channel region of the driving transistor DR, or is dividedly formed respectively corresponding to channel regions of the driving transistor DR, the sensing transistor ST, and the switching transistor SW.

A buffer layer BUF is positioned on the light shielding layer LS. The buffer layer BUF protects transistors formed in the subsequent process from impurities, for example, alkali ions discharged from the light shielding layer LS or the substrate SUB. The buffer layer BUF may be a silicon oxide ($SiO_x$) layer, a silicon nitride ($SiN_x$) layer, or a multilayer thereof.

The first semiconductor layer ACT1 and the third semiconductor layer ACT3 are positioned on the buffer layer BUF and may be formed of a silicon semiconductor or an oxide semiconductor. The silicon semiconductor may include amorphous silicon or crystallized polycrystalline silicon. The polycrystalline silicon has high mobility (for example, more than 100 $cm^2/Vs$), low power consumption, and excellent reliability. Thus, the polycrystalline silicon can be applied to a gate driver and/or a multiplexer (MUX) for use in a driving element or applied to a driving transistor of each pixel. Because the oxide semiconductor has a low OFF-current, the oxide semiconductor is suitable for a switching transistor which has a short ON-time and a long OFF-time. Further, because the oxide semiconductor can increase a voltage hold time of the pixel due to the low OFF-current, the oxide semiconductor is suitable for a display device requiring a low-speed drive and/or low power consumption. In addition, the first and third semiconductor layers ACT1 and ACT3 each include a drain region and a source region each including p-type or n-type impurities, and also includes a channel region between the drain region and the source region.

A gate insulating layer GI is positioned on the first and third semiconductor layers ACT1 and ACT3 and may be a silicon oxide ($SiO_x$) layer, a silicon nitride ($SiN_x$) layer, or a multilayer thereof. A first gate electrode GAT1 is positioned on the gate insulating layer GI at a location corresponding to a predetermined region (e.g., the channel region when impurities are introduced) of the first and third semiconductor layers ACT1 and ACT3. The first gate electrode GAT1 may be formed of one of molybdenum (Mo), aluminum (Al), chrome (Cr), gold (Au), titanium (Ti), nickel (Ni), neodymium (Nd), and copper (Cu), or a combination thereof. Further, the first gate electrode GAT1 may be a multilayer formed of one of molybdenum (Mo), aluminum (Al), chrome (Cr), gold (Au), titanium (Ti), nickel (Ni), neodymium (Nd), and copper (Cu), or a combination thereof. For example, the first gate electrode GAT1 may be formed as a double layer of Mo/Al—Nd or Mo/Al.

An interlayer dielectric layer ILD may be positioned on the first gate electrode GAT1 and insulates the first gate electrode GAT1. The interlayer dielectric layer ILD may be a silicon oxide ($SiO_x$) layer, a silicon nitride ($SiN_x$) layer, or a multilayer thereof. First and second sensing contact holes STCH1 and STCH2 exposing a portion of the first semiconductor layer ACT1 are positioned in a portion of the sensing transistor ST. First and second driving contact holes DRCH1 and DRCH2 exposing a portion of the third semiconductor layer ACT3 are positioned in a portion of the driving transistor DR. Further, a third sensing contact hole STCH3 is positioned between the sensing transistor ST and the driving transistor DR and passes through the interlayer dielectric layer ILD and the buffer layer BUF to expose the light shielding layer LS.

A first source electrode STSE, a first gate electrode GAT1, and a first drain electrode STDE are positioned on the interlayer dielectric layer ILD formed in a portion of the sensing transistor ST. The first drain electrode STDE is connected to the light shielding layer LS through the third sensing contact hole STCH3. A third source electrode STDE (to which the same reference numeral as the first drain electrode is given) formed by extending the first drain electrode STDE, a capacitor upper electrode CSE, and a third drain electrode DRDE which is the first bridge EVDDR1, are positioned on the interlayer dielectric layer ILD formed in a portion of the driving transistor DR. The second bridge EVDDR2 is connected to one side of the driving transistor DR.

The source electrodes, the drain electrodes, the capacitor upper electrode, the first bridge, and the second bridge that are described above, may be formed as a single layer or as a multilayer. When each of the source electrode and the drain electrode is formed as the single layer, each of the source electrode and the drain electrode may be formed of one of molybdenum (Mo), aluminum (Al), chrome (Cr), gold (Au), titanium (Ti), nickel (Ni), neodymium (Nd), and copper (Cu), or a combination thereof. When each of the source electrode and the drain electrode is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo. Thus, the sensing transistor ST and the driving transistor DR are formed. Although not shown, the switching transistor SW is formed.

The third semiconductor layer ACT3 of the driving transistor DR and the second drain electrode SWDE of the switching transistor SW are extended to form a first capacitor C1, and the second drain electrode SWDE and the first electrode ANO form a second capacitor C2. Thus, a dual capacitor of the first capacitor C1 and the second capacitor C2 is formed.

Further, a passivation layer PAS is positioned on the substrate SUB including the sensing transistor ST and the driving transistor DR. The passivation layer PAS is an insulating layer protecting the components underlying the passivation layer PAS and may be a silicon oxide (SiOx) layer, a silicon nitride (SiNx) layer, or a multilayer thereof. A color filter CF is positioned on the passivation layer PAS. The color filter CF converts white light emitted by an organic light emitting diode OLED into one of red, green, and blue light. In an aspect disclosed herein, a red color filter CF may be used by way of example. An overcoat layer OC is positioned on the color filter CF. The overcoat layer OC may be a planarization layer for reducing a height difference of an underlying structure and may be formed of an organic material such as polyimide, benzocyclobutene-based resin, and acrylate. The overcoat layer OC may be formed through a spin-on glass (SOG) method for coating the organic material in a liquid state and then curing the organic material.

A via hole VIA exposing the drain electrode DRDE of the driving transistor DR is positioned in a portion of the overcoat layer OC. The organic light emitting diode OLED is positioned on the overcoat layer OC. More specifically, the organic light emitting diode OLED includes the first electrode ANO on the overcoat layer OC. The first electrode ANO serves as a pixel electrode and is connected to the drain electrode DRDE of the driving transistor DR through the via hole VIA. The first electrode ANO is an anode electrode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd), or a combination thereof. For example, the reflective layer may be formed of an Ag/Pd/Cu (APC) alloy.

In addition, a bank layer BNK defining pixels is positioned on the substrate SUB including the first electrode ANO. The bank layer BNK may be formed of an organic material such as polyimide, benzocyclobutene-based resin, and acrylate. The bank layer BNK includes an emission unit LEP exposing the first electrode ANO. The emission unit LEP of the bank layer BNK includes an emission layer EML contacting the first electrode ANO. The emission layer EML is a layer, in which electrons and holes combine and emit light. The organic light emitting diode OLED may include a hole injection layer and/or a hole transport layer between the emission layer EML and the first electrode ANO and may include an electron injection layer and/or an electron transport layer on the emission layer EML.

The organic light emitting diode OLED includes a second electrode CAT on the emission layer EML. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

With reference to FIG. 7, the first gate electrode GAT1 according to the aspect is disposed on a layer different from the scan line GL1a and is connected to the scan line GL1a through a second gate contact hole GCH2 and a third gate contact hole GCH3.

More specifically, the first power line EVDD1 and the first data line DLn1 are positioned on the substrate SUB. The buffer layer BUF is positioned on the first power line EVDD1 and the first data line DLn1, and the first semiconductor layer ACT1 and the second semiconductor layer ACT2 are positioned on the buffer layer BUF. The first semiconductor layer ACT1 constitutes the sensing transistor, and the second semiconductor layer ACT2 constitutes the switching transistor. The gate insulating layer GI is positioned on the first semiconductor layer ACT1 and the second semiconductor layer ACT2, and the first gate electrode GAT1 is positioned on the gate insulating layer GI. The first gate electrode GAT1 is patterned and formed in an island shape.

The interlayer dielectric layer ILD is positioned on the first gate electrode GAT1, and the second gate contact hole GCH2 and the third gate contact hole GCH3 exposing a portion of the first gate electrode GAT1 are positioned in the interlayer dielectric layer ILD. The scan line GL1a is positioned on the interlayer dielectric layer ILD. The scan line GL1a is connected to the first gate electrode GAT1 through the second gate contact hole GCH2 and the third gate contact hole GCH3. The passivation layer PAS is positioned on the scan line GL1a, and the overcoat layer OC and the bank layer BNK is positioned on the passivation layer PAS.

With reference to FIGS. 5 to 7, in the aspect, the vertically arranged lines, namely, the first and second power lines EVDD1 and EVDD2, the first to fourth data lines DLn1 to DLn4, and the sensing line VREF are positioned on the same plane and are also positioned on the same plane as the light shielding layer LS. In aspects disclosed herein, "the same plane" indicates that the components are positioned on the same layer. For example, aspects indicate that the components are positioned on the buffer layer BUF. Namely, the first and second power lines EVDD1 and EVDD2, the first to fourth data lines DLn1 to DLn4, the sensing line VREF, and the light shielding layer LS are simultaneously formed using the same material through the patterning. Thus, the first and second power lines EVDD1 and EVDD2, the first to fourth data lines DLn1 to DLn4, and the sensing line VREF are disposed on a layer different from the scan line GL1a.

The first power line EVDD1 is connected to the first and second bridges EVDDR1 and EVDDR2 positioned on the interlayer dielectric layer ILD through the power contact hole ECH and supplies a power voltage to the first subpixel SPn1 and the second subpixel SPn2. Further, the first data line DLn1 is connected to a drain electrode (not shown) of the switching transistor SW positioned on the interlayer dielectric layer ILD through the data contact hole DLCH.

In the aspect, the scan line GL1a is positioned on the same plane as the source electrode. Namely, the scan line GL1a and the source electrode are simultaneously formed using the same material through the patterning. Thus, the scan line GL1a is disposed on a layer different from the first and second power lines EVDD1 and EVDD2, the first to fourth data lines DLn1 to DLn4, and the sensing line VREF. In this instance, as a distance between the scan line GL1a and the semiconductor layers ACT1 to ACT3 increases, the transistors are difficult to operate properly. Thus, in the aspect of the present disclosure, the gate insulating layer GI is formed on the semiconductor layers ACT1 to ACT3, and the first gate electrode GAT1 is additionally formed directly on the gate insulating layer GI. Thus, the second and third gate contact holes GCH2 and GCH3 are formed in the interlayer dielectric layer ILD on the first gate electrode GAT1 and connect the first gate electrode GAT1 to the scan line GL1a.

As described above, in the first aspect, the vertically arranged lines are positioned on the same plane as the light shielding layer, and the horizontally arranged lines are positioned on the same plane as the source electrode. Hence, the first aspect can prevent a defective drive caused by the short circuit by increasing a thickness of the insulating layer between the vertically arranged lines and the horizontally arranged lines. Further, the first aspect connects the gate electrode to the horizontally arranged scan line, thereby reducing a resistance of the scan line. As a result, there is an advantage of an improvement in the RC delay.

Figure 8:
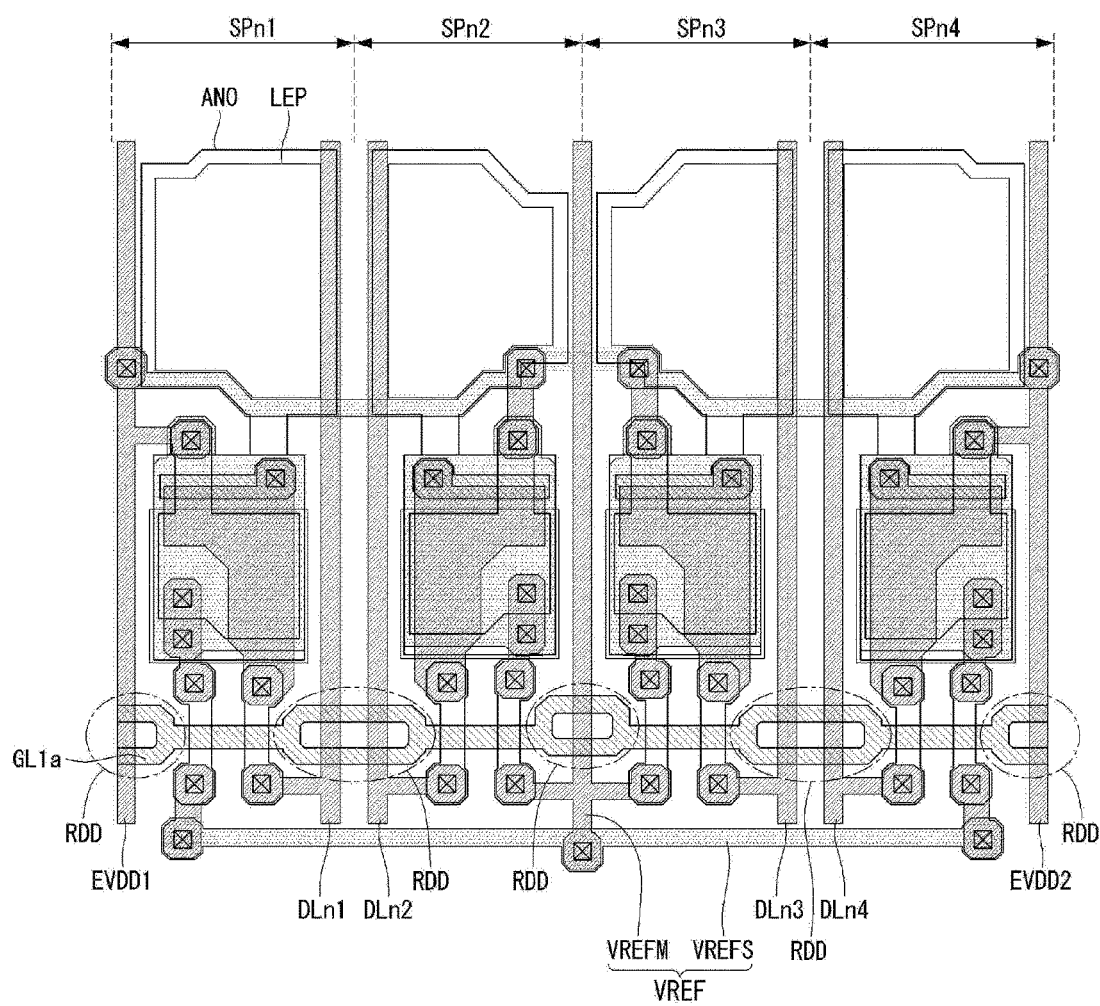
FIG. 8 is a plan view of a subpixel array of a display device according to the comparative example.
Figure 9:
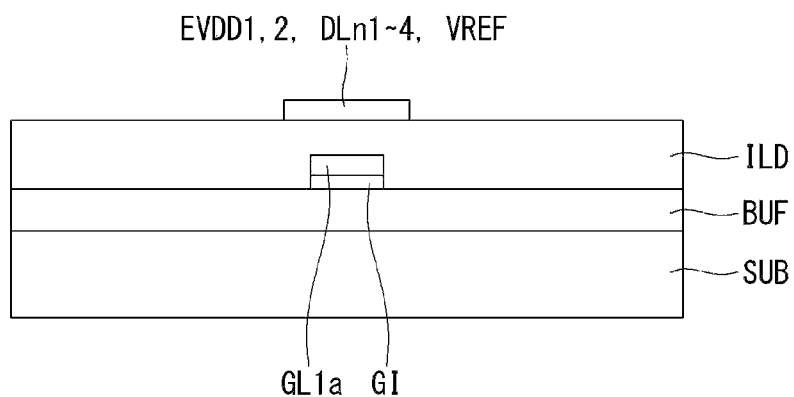
FIG. 9 illustrates a cross-sectional structure of lines according to the comparative example.
Figure 10:
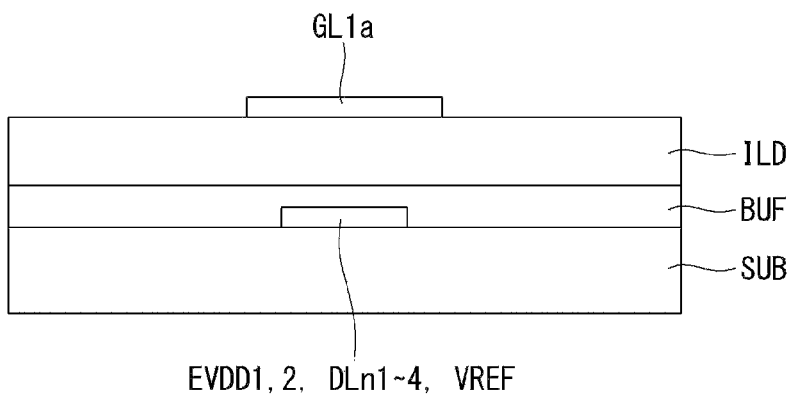
FIG. 10 illustrates a cross-sectional structure of lines according to an example of the aspect of the present disclosure.

FIG. 8 is a plan view of a subpixel array of a display device according to the comparative example. FIG. 9 illustrates a cross-sectional structure of lines according to the comparative example. FIG. 10 illustrates a cross-sectional structure of lines according to the example of the aspect of the present disclosure. In the following description, structures and components identical or equivalent to those described in the first aspect are designated with the same reference numerals, and a further description may be briefly made or may be omitted.

In the example of FIG. 8, first to fourth subpixels SPn1 to SPn4 are arranged in a horizontal direction. A first power line EVDD1 is disposed on the left side of the first subpixel SPn1 along a vertical direction, and a second power line EVDD2 is disposed on the right side of the fourth subpixel SPn4 along the vertical direction. The first power line EVDD1 is commonly connected to the first subpixel SPn1 and the second subpixel SPn2, and the second power line EVDD2 is commonly connected to the third subpixel SPn3 and the fourth subpixel SPn4. A first data line DLn1 and a second data line DLn2 are disposed between the first subpixel SPn1 and the second subpixel SPn2. The first data line DLn1 is connected to the first subpixel SPn1, and the second data line DLn2 is connected to the second subpixel SPn2. A sensing line VREF is disposed between the second subpixel SPn2 and the third subpixel SPn3. The sensing line VREF is commonly connected to the first to fourth subpixels SPn1 to SPn4. A third data line DLn3 and a fourth data line DLn4 are disposed between the third subpixel SPn3 and the fourth subpixel SPn4. The third data line DLn3 is connected to the third subpixel SPn3, and the fourth data line DLn4 is connected to the fourth subpixel SPn4. A scan line GL1a is disposed perpendicular to the first power line EVDD1 in the first to fourth subpixels SPn1 to SPn4.

With reference to FIG. 9, a display device according to the comparative example is configured such that all of the first and second power lines EVDD1 and EVDD2, the first to fourth data lines DLn1 to DLn4, and the sensing line VREF are formed using the same material and are positioned on an interlayer dielectric layer ILD. The scan line GL1a is positioned between the interlayer dielectric layer ILD and a gate insulating layer GI.

Because the first and second power lines EVDD1 and EVDD2, the first to fourth data lines DLn1 to DLn4, and the sensing line VREF are disposed to intersect the scan line GL1a, they overlap each other at intersections of the lines EVDD1, EVDD2, DLn1 to DLn4, and VREF and the scan line GL1a. The first and second power lines EVDD1 and EVDD2, the first to fourth data lines DLn1 to DLn4, and the sensing line VREF are positioned opposite the scan line GL1a with the interlayer dielectric layer ILD interposed therebetween. As described above, because one insulating layer is formed between the scan line GL1a and the line overlapping the scan line GL1a, a defective drive is caused when a short circuit is generated between the overlapping lines.

Thus, as shown in FIG. 8, the scan line GL1a includes a branch portion RDD so that a repair operation can be performed when the short circuit is generated between the scan line GL1a and the line overlapping the scan line GL1a. In the display device according to the comparative example, the scan line GL1a includes a total of five branch portions RDD in the first to fourth subpixels SPn1 to SPn4. Hence, the display device according to the comparative example is very disadvantageous in terms of the design and an aperture ratio of the subpixels.

As shown in FIG. 10, in the display device according to the aspect of the present disclosure, the buffer layer BUF as well as the interlayer dielectric layer ILD are additionally formed between the first and second power lines EVDD1 and EVDD2, the first to fourth data lines DLn1 to DLn4, and the sensing line VREF and the scan line GL1a. Thus, the display device according to the aspect of the disclosure can prevent a defective drive caused by the short circuit by increasing a thickness of the insulating layer between the vertically arranged lines and the horizontally arranged lines. Hence, the aspect of the disclosure can facilitate the design of the subpixels by removing the branch portion of the scan line and improve an aperture ratio of the subpixels.

The following Table 1 illustrates a result of measuring an aperture ratio of the subpixel according to the comparative example and an aperture ratio of the subpixel according to the first aspect.

TABLE 1

|  | Unit pixel structure | Comparative example | Aspect of the Disclosure |
| --- | --- | --- | --- |
| Aperture ratio (%) | WRGB/WRGB | Not designable | 16.0 |

As indicated by the above Table 1, when a unit pixel had a structure of WRGB, it was impossible to design the subpixels in the comparative example. However, in the first aspect, the subpixels could be designed with an aperture ratio of 16.0%.

It was confirmed from the above Table 1 that the display device according to the first aspect can completely remove the branch portion of the scan line by forming the vertically arranged lines and the light shielding layer on the same layer to increase an overlap distance between the vertically arranged lines and the horizontally arranged lines, thereby facilitating the design of the subpixels and securing the aperture ratio of the subpixels.

The following Table 2 illustrates a result of measuring a resistance of the scan line, a capacitance of the entire display panel, and RC delay in each of the subpixel according to the comparative example and the subpixel according to the aspect of the disclosure.

TABLE 2

|  | Comparative Example | Aspect of the Present Disclosure |
| --- | --- | --- |
| Resistance (kΩ) | 10.9 | 5.8 |
| Capacitance (pF) | 926 | 930 |
| 2.2τ (μs) | 2.78 | 1.48 |

As indicated by the above Table 2, a resistance of the scan line in the first aspect was reduced by 5.1 kΩ compared to the comparative example. Further, 2.2τ in the aspect of the disclosure was reduced by 1.30 μs compared to the comparative example. On the other hand, a capacitance of the entire display panel was measured at the similar level in the comparative example and the aspect of the present disclosure.

It was confirmed from the above Table 2 that the display device according to the first aspect can reduce the resistance of the scan line by additionally connecting the gate electrode to the scan line, thereby reducing the RC delay.

The display device according to the aspect may include a triple capacitor in order to additionally secure the capacitance to the subpixel.

Figure 11:
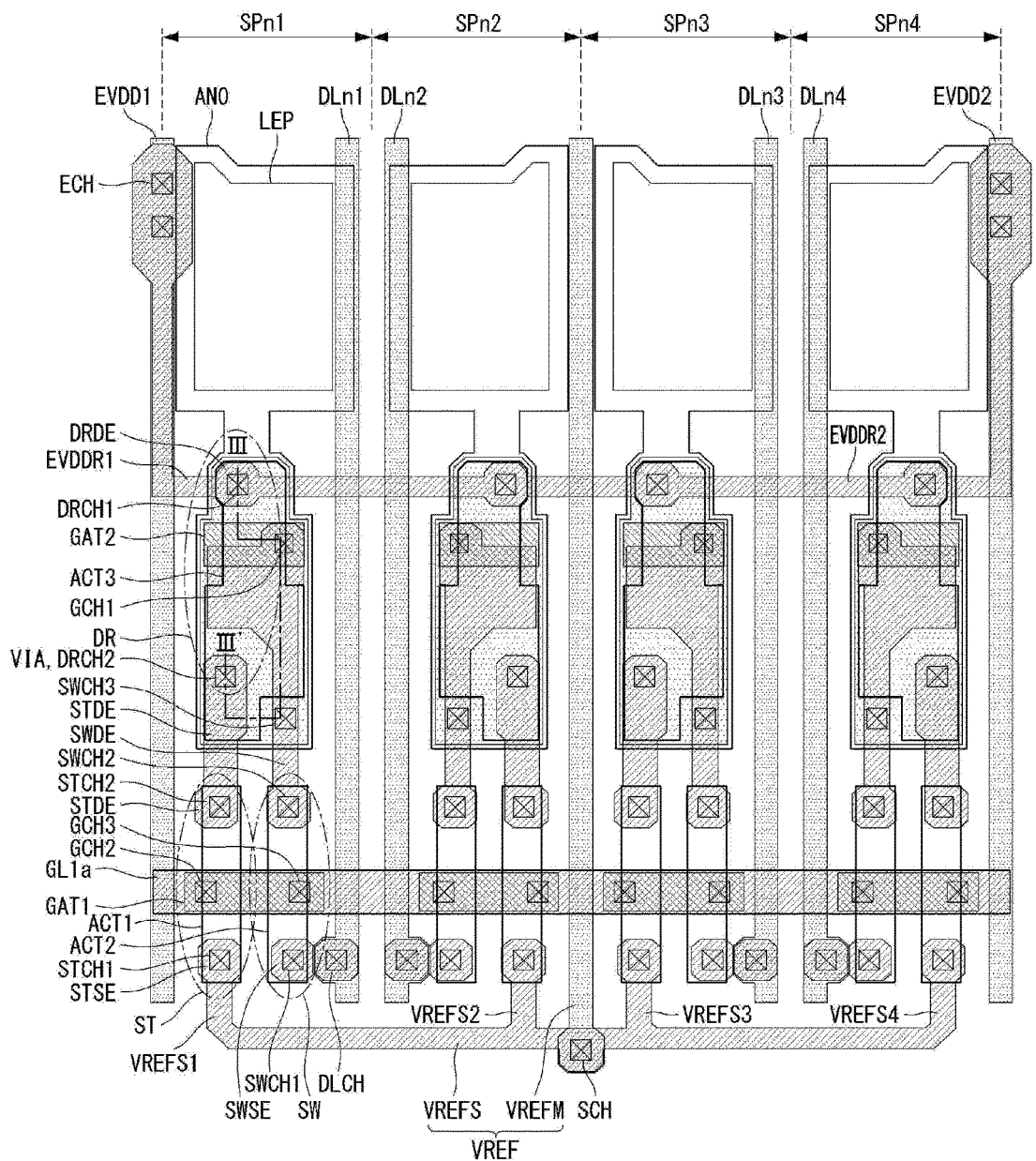
FIG. 11 is a plan view of a subpixel array according to another example of the aspect of the present disclosure.
Figure 12:
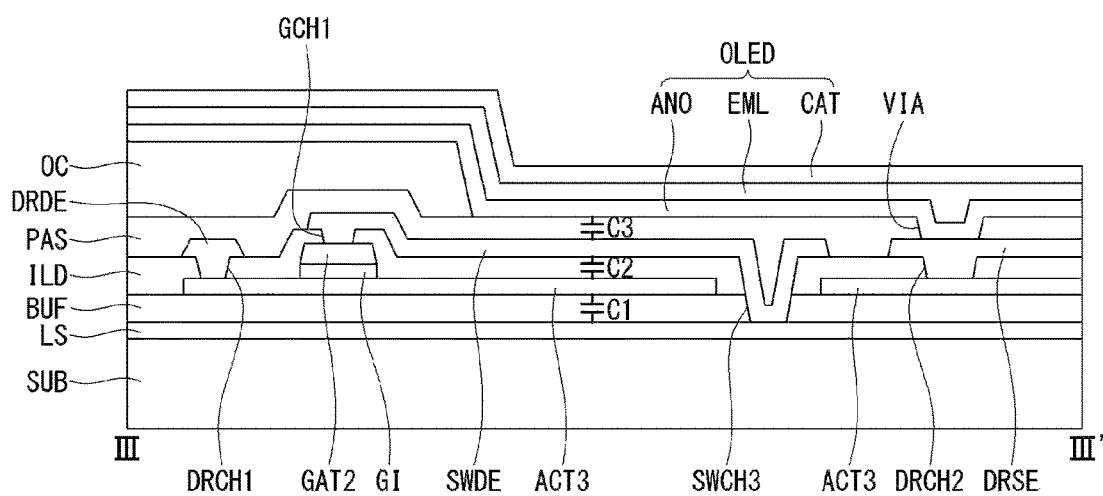
FIG. 12 is a cross-sectional view taken along line III-III' of FIG. 11.

FIG. 11 is a plan view of a subpixel array according to another example of the aspect of the present disclosure. FIG. 12 is a cross-sectional view taken along line III-III' of FIG. 11. In the following description, structures and components identical or equivalent to those described in the previous aspect are designated with the same reference numerals, and a further description may be briefly made or may be omitted.

With reference to FIG. 11, first to fourth subpixels SPn1 to SPn4 are arranged in a horizontal direction (for example, X-axis direction). A first power line EVDD1 is disposed on the left side of the first subpixel SPn1 along a vertical direction (for example, Y-axis direction). The first power line EVDD1 is commonly connected to the first subpixel SPn1 and the second subpixel SPn2. The first power line EVDD1 includes a first bridge EVDDR1 that is extended from the first power line EVDD1 through a power contact hole ECH and is connected to the first and second subpixels SPn1 and SPn2. A first data line DLn1 is disposed in an area of the first subpixel SPn1 that is away from the first power line EVDD1 and is adjacent to the second subpixel SPn2, and a second data line DLn2 is disposed in an area of the second subpixel SPn2 adjacent to the first data line DLn1. The first data line DLn1 is connected to the first subpixel SPn1, and the second data line DLn2 is connected to the second subpixel SPn2. A sensing line VREF is disposed between the second subpixel SPn2 and the third subpixel SPn3. The sensing line VREF is commonly connected to the first to fourth subpixels SPn1 to SPn4.

A third data line DLn3 is disposed in an area of the third subpixel SPn3 that is away from the sensing line VREF and is adjacent to the fourth subpixel SPn4, and a fourth data line DLn4 is disposed in an area of the fourth subpixel SPn4 adjacent to the third data line DLn3. The third data line DLn3 is connected to the third subpixel SPn3, and the fourth data line DLn4 is connected to the fourth subpixel SPn4. A second power line EVDD2 is disposed on the right side of the fourth subpixel SPn4 along the vertical direction. The second power line EVDD2 is commonly connected to the third subpixel SPn3 and the fourth subpixel SPn4. The second power line EVDD2 includes a second bridge EVDDR2 that is extended from the second power line EVDD2 through a power contact hole ECH and is commonly connected to the third and fourth subpixels SPn3 and SPn4. The third and fourth subpixels SPn3 and SPn4 are connected to the second power line EVDD2 through the second bridge EVDDR2. Although not shown, the second power line EVDD2 is commonly connected to two subpixels disposed on the right side of the second power line EVDD2. The first bridge EVDDR1 and the second bridge EVDDR2 are connected to form one body and receive the same power voltage from the first power line EVDD1 and the second power line EVDD2.

A scan line GL1a perpendicularly intersecting the sensing line VREF is disposed on the first to fourth subpixels SPn1 to SPn4. The scan line GL1a is connected to gate electrodes of a sensing transistor ST and a switching transistor SW of each of the first to fourth subpixels SPn1 to SPn4.

The sensing line VREF includes a vertical sensing line VREFM disposed along the vertical direction and a horizontal sensing line VREFS disposed along the horizontal direction. The vertical sensing line VREFM is disposed on a layer different from the horizontal sensing line VREFS. Namely, the horizontal sensing line VREFS is connected to the vertical sensing line VREFM through a sensing contact hole SCH. The horizontal sensing line VREFS is divided into first to fourth horizontal sensing lines VREFS1 to VREFS4, and the first to fourth horizontal sensing lines VREFS1 to VREFS4 are respectively connected to the sensing transistors ST of the first to fourth subpixels SPn1 to SPn4.

A plan structure of the subpixel is described using the first subpixel SPn1 as an example. The switching transistor SW is disposed at an intersection of the first data line DLn1 and the scan line GL1a, and the sensing transistor ST is disposed adjacent to the first horizontal sensing line VREFS1 and the scan line GL1a.

The sensing transistor ST includes a first source electrode STSE in which the first horizontal sensing line VREFS1 is connected to a first semiconductor layer ACT1 through a first sensing contact hole STCH1, a first drain electrode STDE connected to the first semiconductor layer ACT1 through a second sensing contact hole STCH2, and a first gate electrode GAT1 crossing the first semiconductor layer ACT1.

The switching transistor SW includes a second source electrode SWSE that is connected to the first data line DLn1 through a data contact hole DLCH and is connected to a second semiconductor layer ACT2 through a first switching contact hole SWCH1, a second drain electrode SWDE connected to the second semiconductor layer ACT2 through a second switching contact hole SWCH2, and a first gate electrode GAT1 crossing the second semiconductor layer ACT2. The second drain electrode SWDE of the switching transistor SW is connected to a second gate electrode GAT2 of the driving transistor DR through a first gate contact hole GCH1. Further, the second drain electrode SWDE of the switching transistor SW is connected to the light shielding layer LS through a third switching contact hole SWCH3.

The driving transistor DR includes a third drain electrode DRDE in which the first bridge EVDDR1 connected to the power contact hole ECH of the first power line EVDD1 is connected to a third semiconductor layer ACT3 through a first driving contact hole DRCH1. The first drain electrode STDE of the sensing transistor ST operates as a third source electrode of the driving transistor DR. A first electrode ANO is connected to the driving transistor DR through a via hole VIA, and an emission unit LEP is disposed on the first electrode ANO to emit light. As a result, the plan structure of the first subpixel SPn1 is completed.

More specifically, a cross-sectional structure of the display panel will be described below using a portion of the first subpixel as an example.

With reference to FIG. 12, a light shielding layer LS is positioned on a substrate SUB, and a buffer layer BUF is positioned on the light shielding layer LS. The third semiconductor layer ACT3 is positioned on the buffer layer BUF, and a gate insulating layer GI is positioned on the third semiconductor layer ACT3. A second gate electrode GAT2 is positioned in a predetermined region of the third semiconductor layer ACT3. An interlayer dielectric layer ILD is positioned on the second gate electrode GAT2 and insulates the second gate electrode GAT2. First and second driving contact holes DRCH1 and DRCH2 exposing a portion of the third semiconductor layer ACT3 are positioned in a portion of the driving transistor DR. Further, a third switching contact hole SWCH3 is positioned between the switching transistor SW and the driving transistor DR and passes through the interlayer dielectric layer ILD and the buffer layer BUF to expose the light shielding layer LS.

The third drain electrode DRDE, the second gate electrode GAT2, and a third source electrode DRSE are positioned on the interlayer dielectric layer ILD formed in a portion of the driving transistor DR. The second drain electrode SWDE is positioned on the second gate electrode GAT2 and is connected to the second gate electrode GAT2 through the first gate contact hole GCH1 penetrating the interlayer dielectric layer ILD. The second drain electrode SWDE is connected to the light shielding layer LS through the third switching contact hole SWCH3. Thus, because the light shielding layer LS is connected to the second gate electrode GAT2 and is positioned below the third semiconductor layer ACT3, the light shielding layer LS may serve as a double gate.

A passivation layer PAS is positioned on the substrate SUB, and an overcoat layer OC is positioned on the passivation layer PAS. A via hole VIA exposing the third source electrode DRSE of the driving transistor DR is positioned in a portion of the overcoat layer OC and the passivation layer PAS. A first electrode ANO is positioned on the overcoat layer OC and is connected to the third source electrode DRSE of the driving transistor DR through the via hole VIA.

The aspect of the disclosure may form a triple capacitor by connecting the second gate electrode GAT2 to the second drain electrode SWDE and connecting the second drain electrode SWDE to the light shielding layer LS. More specifically, a first capacitor C1 is formed between the light shielding layer LS and the third semiconductor layer ACT3, a second capacitor C2 is formed between the third semiconductor layer ACT3 and the second drain electrode SWDE, and a third capacitor C3 is formed between the second drain electrode SWDE and the first electrode ANO.

Thus, the aspect can reduce an area occupied by the capacitor by forming the triple capacitor in the vertical direction, thereby increasing an area of the emission unit by a reduction in the area of the capacitor. Further, the aspect can form the driving transistor of a double gate structure because the light shielding layer serves as a gate electrode. Hence, the aspect can reduce a bias stress and improve mobility of the driving transistor.

The following Table 3 illustrates a result of measuring an aperture ratio of the subpixel according to the first aspect and an aperture ratio of the subpixel according to the second aspect. More specifically, the following Table 3 illustrates the aperture ratio of the subpixel according to the second aspect with respect to the aperture ratio of the subpixel according to the first aspect set to 100%.

TABLE 3

| | Unit pixel structure | An Aspect of the Disclosure | Another Aspect of the disclosure |
|---|---|---|---|
| Aperture ratio (%) | WRGB/WRGB | 100% | 195% |

As indicated by the above Table 3, when a unit pixel had a structure of WRGB, an aperture ratio of another aspect was improved to about 195% through an increase by about 95% compared to the aperture ratio of an aspect as 100%.

It was confirmed from the above Table 3 that the display device according to the second aspect can reduce the area of the capacitor and increase the aperture ratio through a reduction in the area of the capacitor by connecting the gate electrode of the driving transistor to the light shielding layer to form the triple capacitor between the light shielding layer and the third semiconductor layer, between the third semiconductor layer and the second drain electrode, and between the second drain electrode and the first electrode.

As described above, the aspects are configured such that the vertically arranged lines are positioned on the same plane as the light shielding layer and the horizontally arranged lines are positioned on the same plane as the source electrode, and thus can prevent the defective drive caused by the short circuit by increasing a thickness of the insulating layer between the vertically arranged lines and the horizontally arranged lines. Further, the aspects can reduce a resistance of the scan line by connecting the gate electrode to the horizontally arranged scan line, and thus improve the RC delay.

Furthermore, the aspects can reduce an area of the capacitor and increase the aperture ratio through a reduction in the area of the capacitor by connecting the gate electrode of the driving transistor to the light shielding layer to form the triple capacitor between the light shielding layer and the third semiconductor layer, between the third semiconductor layer and the second drain electrode, and between the second drain electrode and the first electrode. Further, the aspects can form the driving transistor of the double gate structure because the light shielding layer serves as a gate electrode. Hence, the aspects can reduce a bias stress and improve mobility of the driving transistor.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device having a substrate, comprising:
    a light shielding layer on the substrate;
    first, second, third and fourth subpixels sequentially arranged on the substrate in a horizontal direction;
    a first power line disposed on one side of the first subpixel and connected to the first and second subpixels;
    a sensing line disposed between the second subpixel and the third subpixel and connected to the first to fourth subpixels;
    a second power line disposed on one side of the fourth subpixel and connected to the third and fourth subpixels;
    first and second data lines disposed between the first subpixel and the second subpixel and third and fourth data lines disposed between the third subpixel and the fourth subpixel; and
    a scan line on the first to fourth subpixels and extended to the horizontal direction,
    wherein the first to fourth data lines, the sensing line, and the first and second power lines are disposed on the same plane as the light shielding layer.

2. The display device of claim 1, wherein the scan line is disposed on a layer different from the first to fourth data lines, the sensing line, and the first and second power lines.

3. The display device of claim 1, wherein the sensing line includes a vertical sensing line and a horizontal sensing line, and
    wherein the vertical sensing line is disposed on the same plane as the first data line in parallel with the first data line, and the horizontal sensing line is disposed on the same plane as the scan line in parallel with the scan line.

4. The display device of claim 3, wherein the horizontal sensing line is connected to each of the first to fourth subpixels through first to fourth horizontal sensing lines divided from the horizontal sensing line.

5. The display device of claim 1, wherein the first power line includes a first bridge and a second bridge that are connected to each other through a power contact hole,
    wherein the first bridge is connected to the first subpixel, and the second bridge is connected to the second subpixel.

6. The display device of claim 1, wherein the second power line includes a third bridge and a fourth bridge that are connected to each other through a power contact hole, wherein the third bridge is connected to the fourth subpixel, and the fourth bridge is connected to the third subpixel.

7. The display device of claim 1, wherein each of the first to fourth subpixels has a first gate electrode connected to the scan line through gate contact holes underlying the scan line.

8. The display device of claim 7, wherein the first gate electrode is formed as an island shape, and both ends of the first gate electrode are connected to the scan line.

9. The display device of claim 1, wherein each of the first to fourth subpixels includes a switching transistor overlapping the scan line, a sensing transistor connected to the sensing line, a driving transistor connected to one of the first power line and the second power line, and a first electrode connected to the driving transistor.

10. The display device of claim 9, wherein each of the first to fourth subpixels has one end of a drain electrode of the switching transistor connected to a second gate electrode of the driving transistor and the other end connected to the light shielding layer.

11. The display device of claim 10, wherein the light shielding layer and a semiconductor layer of the driving transistor form a first capacitor, the semiconductor layer of the driving transistor and the drain electrode of the switching transistor form a second capacitor, and the drain electrode of the switching transistor and the first electrode form a third capacitor.

12. The display device of claim 1, further comprising a buffer layer on the substrate, wherein the first to fourth data lines, the sensing line, the first and second power lines and a the light shielding layer are disposed on the buffer layer.

13. The display device of claim 1, wherein the first to fourth data lines, the sensing line, the first and second power lines and a the light shielding layer are formed of the same material.

14. The display device of claim 1, wherein the scan line is disposed on the first to fourth subpixels, perpendicularly intersects the sensing line and is disposed on a layer different from the first to fourth data lines, the sensing line, and the first and second power lines.

15. The display device of claim 3, wherein the scan line is disposed on the same layer as the horizontal sensing line.

16. A display device comprising first, second, third and fourth subpixels arranged on a substrate in a horizontal direction, each subpixel having a driving transistor, a switching transistor, and a sensing transistor, comprising:
   a light shielding layer on the substrate, shielding external light and connected to a source electrode of the driving transistor;
   a first power line disposed on one side of the first subpixel and connected to the first and second subpixels by first and second bridges extended from the first power line through a first power contact hole;
   a sensing line disposed between the second subpixel and the third subpixel and commonly connected to the first to fourth subpixels;
   a second power line disposed on one side of the fourth subpixel and connected to the third and fourth subpixels by third and fourth bridges extended from the second power line through a second power contact hole;
   first and second data lines disposed between the first subpixel and the second subpixel and third and fourth data lines disposed between the third subpixel and the fourth subpixel; and
   a scan line on the first to fourth subpixels and extended to the horizontal direction,
   wherein the first to fourth data lines, the sensing line, and the first and second power lines are disposed on the same plane as the light shielding layer.

17. The display device of claim 16, wherein the first, second, third and fourth data line are connected to the first, second third and fourth subpixels, respectively.

18. The display device of claim 16, wherein the second bridge and the fourth bridge are connected to form one body and receive the same power voltage from the first and second power lines.

19. The display device of claim 16, wherein the scan line perpendicularly intersects the sensing line.

20. The display device of claim 16, wherein the scan line is connected to gate electrodes of the sensing transistor and the switching transistor of each of the first to fourth subpixels.

21. The display device of claim 16, wherein the scan line is disposed on a layer different from the first to fourth data lines, the sensing line, and the first and second power lines.

* * * * *